United States Patent
Yaung et al.

(10) Patent No.: US 6,642,076 B1
(45) Date of Patent: Nov. 4, 2003

(54) ASYMMETRICAL RESET TRANSISTOR WITH DOUBLE-DIFFUSED SOURCE FOR CMOS IMAGE SENSOR

(75) Inventors: Dun-Nian Yaung, Taipei (TW); Shou-Gwo Wuu, Hsin-Chu (TW); Ho-Ching Chien, Hsin-Chu (TW); Chien-Hsien Tseng, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/278,134

(22) Filed: Oct. 22, 2002

(51) Int. Cl.[7] ............................................... H01L 21/00
(52) U.S. Cl. ......................... 438/48; 438/197; 438/200; 257/288; 257/292
(58) Field of Search ............................... 438/48, 57, 59, 438/73, 197, 199, 200, 79, 229, 275, 279, 163; 257/288, 290, 292

(56) References Cited

U.S. PATENT DOCUMENTS

| | | | |
|---|---|---|---|
| 6,040,593 A | * | 3/2000 | Park ........................... 257/292 |
| 6,194,258 B1 | | 2/2001 | Wuu ........................... 438/200 |
| 6,306,678 B1 | | 10/2001 | Chiang et al. ................. 438/60 |
| 6,323,054 B1 | | 11/2001 | Yaung et al. .................. 438/75 |
| 6,347,054 B1 | | 2/2002 | Wang et al. ........... 365/185.29 |
| 6,486,521 B2 | * | 11/2002 | Zhao et al. .................. 257/443 |

* cited by examiner

Primary Examiner—Ngân V. Ngô
Assistant Examiner—Theresa T. Doan
(74) Attorney, Agent, or Firm—George O. Saile; Stephen B. Ackerman; Douglas R. Schnabel (57) ABSTRACT

A new method to form CMOS image sensors in the manufacture of an integrated circuit device is achieved. The method comprises providing a semiconductor substrate. Sensor diodes are formed in the semiconductor substrate each comprising a first terminal and a second terminal. Gates are formed for transistors in the CMOS image sensors. The gates comprise a conductor layer overlying the semiconductor substrate with an insulating layer therebetween. The transistors include reset transistors. Ions are implanted into the semiconductor substrate to form source/drain regions for the transistors. The source regions of the reset transistors are formed in the first terminals of the sensor diodes. Ions are implanted into the reset transistor sources to form double diffused sources. The implanting is blocked from other source/drain regions.

13 Claims, 7 Drawing Sheets

ASYMMETRICAL RESET TRANSISTOR WITH DOUBLE-DIFFUSED SOURCE FOR CMOS IMAGE SENSOR

BACKGROUND OF THE INVENTION (1) Field of the Invention

The invention relates to a CMOS image sensor device and, more particularly, to a method to form an improved CMOS image sensor with a double-diffused source on the reset transistor.

(2) Description of the Prior Art

CMOS image sensors have many advantages over CCD sensors. For example, CMOS image sensors demonstrate low voltage operation, low power consumption, compatibility with logic circuits, random access, and low cost. As device dimensions shrink to 0.25 microns, shallow trench isolations (STI) are widely used for device isolation. However, crystal defects located at STI corners can create leaky pixels.

Figure 1:
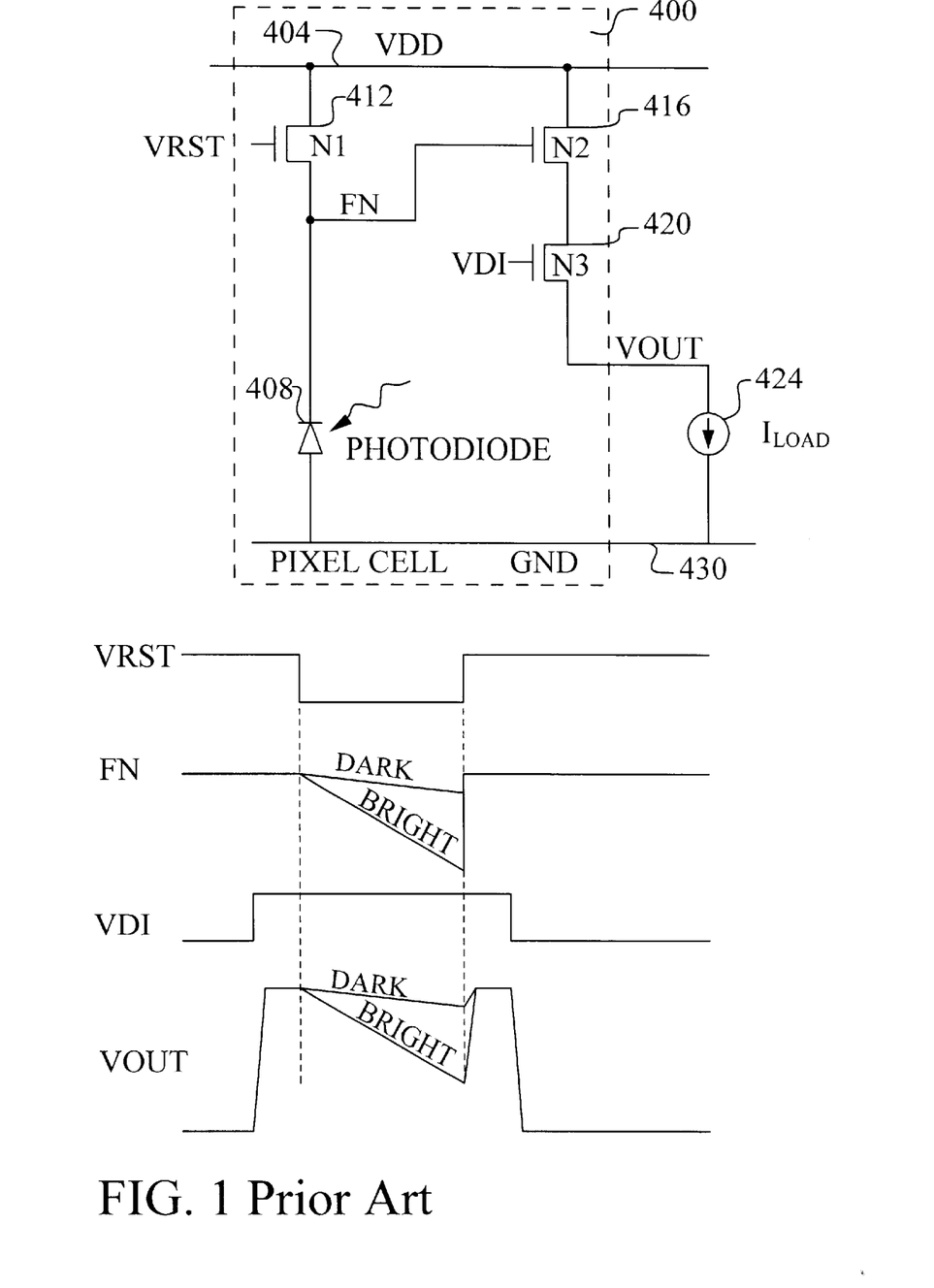
FIG. 1 illustrates, in schematic form, a CMOS pixel cell and its electrical performance.

Referring now to FIG. 1, a conventional CMOS pixel cell 400 is shown in schematic form. The pixel cell 400 comprises a photodiode sensor 408. The photodiode sensor 408 is reverse biased between the power supply VDD 404 and GROUND 430 such that it will conduct only a small leakage current. However, the photodiode 408 is sensitive to incident light. Light will cause the reverse current to increase.

The CMOS sensor pixel 400 comprises three additional transistors N1 412, N2 416, and N3 420. The first transistor N1 412 is the reset transistor for the cell 400. The cell is operated in a cycle. First, the reset transistor N1 412 is turned ON as shown by the high state of VRST. The node between the photodiode 408 and the reset transistor N1 412 is the floating node (FN). When the reset transistor N1 is ON, FN is pulled up to VDD 404. The photodiode 408 is then fully reverse biased and has the maximum depletion region.

The reset control signal VRST is next forced low to turn OFF the reset transistor N1. The photodiode sensor 408 will now react to incident light by generating reverse leakage current. The leakage current will discharge the floating node (FN) as shown. If the pixel is in the presence of a bright light, a large current will be generated by the photo effect. This current will discharge FN at a rate of, for example, about 200 mV/second or more. If the pixel is in the dark, the leakage current generated will discharge FN at a rate of only about 20 mV/second or less.

The FN voltage is coupled to the gate of the source follower transistor N2 416. The source of N2 416 follows the gate voltage FN with a voltage drop. For example, the FN node during reset may be forced to about 2.5 V if VDD is about 3.3 V. In this case, the source of N2 416 will be about 2.2 V during reset. After the reset transistor N1 412 is turned OFF, FN begins to drop at a rate that reflects the relative light intensity incident on the pixel 400 photodiode 408 as described above. This voltage is reflected on the source follower node but with a low output resistance such that any additional loading does not affect the operation of the diode. The row selector transistor N3 420 is used to select a particular row of pixels 400 for sampling. The row selector transistor N3 420 is turn ON by the VDI signal that is controlled by the sampling circuit, not shown.

In this example case, a constant load $I_{LOAD}$ 424 is coupled to the pixel output VOUT. If the row selector transistor N3 420 for this pixel 400 is turned ON, then the constant load is coupled to the source follower output such that the FN signal is effectively coupled to the output node VOUT. The difference between a dark condition and a bright light condition on the photodiode 408 can be easily seen. During a sampling operation, the VOUT signal is sampled at a fixed number of milliseconds after the reset transistor N1 is turned OFF. The sampled voltage VOUT corresponds to the relative light intensity. It may be used, therefore, to scan an image by combining the samples of a large array of pixels.

Figure 2:
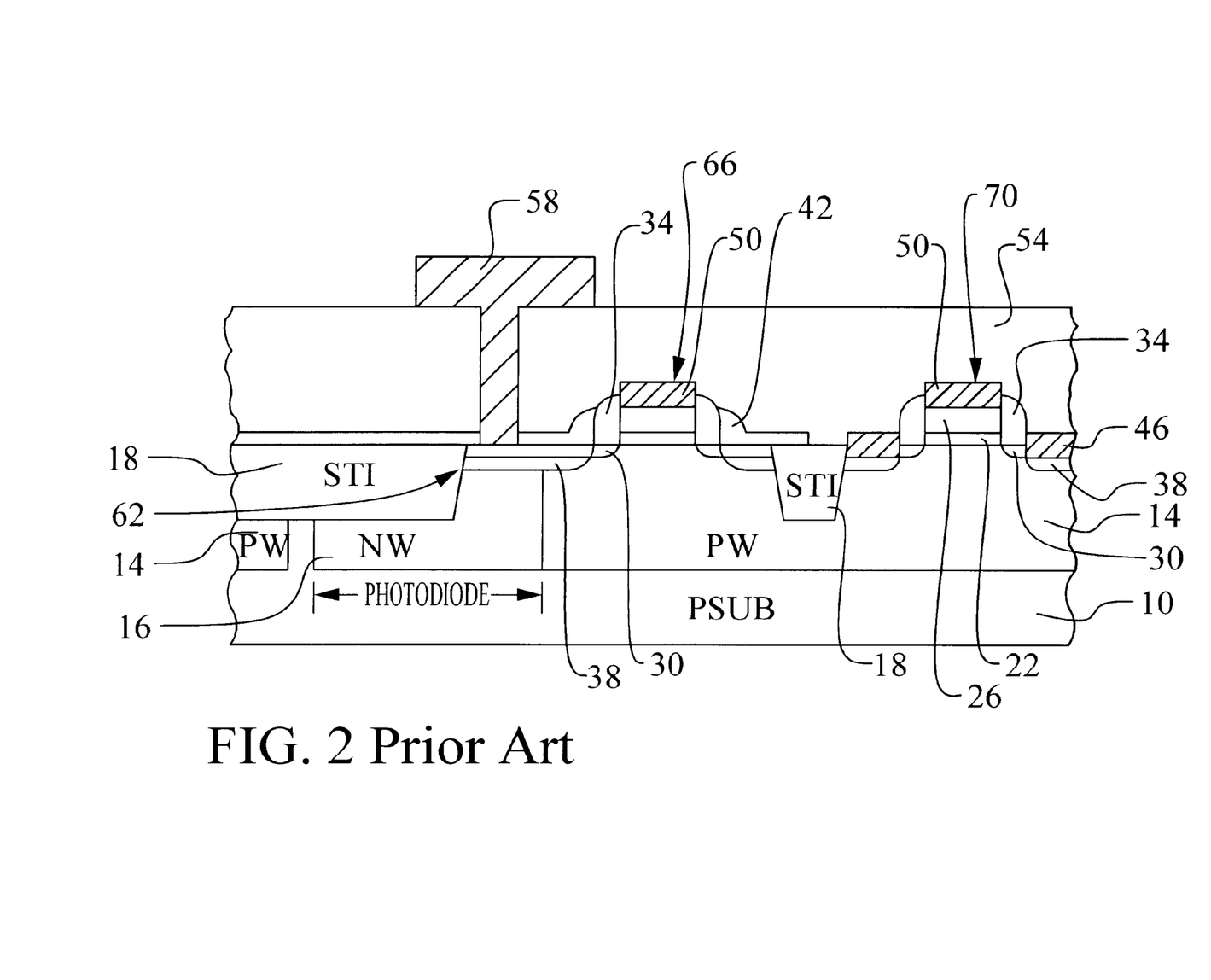
FIG. 2 illustrates, in cross section, a part of a prior art CMOS pixel cell identifying the problem of STI defect induced leakage.

Referring now to FIG. 2, a cross sectional view of a part of the pixel structure is shown. The photodiode is formed by the n-well (NW) region 16 and the p-substrate (PSUB) 10. The NW 16 forms a first terminal of the p-n diode while the PSUB 10 forms a second terminal. Under reverse bias, a depletion region forms between NW 16 and PSUB 10. The photoelectric current is generated as light photons interact within this depletion region. Two MOS transistors 66 and 70 are also shown in the cross section. One transistor 66 has the source region 38 formed in the NW 16 terminal of the photodiode. This transistor 66 is the reset transistor for the pixel cell.

Shallow trench isolation (STI) regions 18 are used in this technology to enable very small dimensions as described above. A particular problem may occur in the STI 18. Defects 62 may form in the STI-semiconductor substrate interface due to manufacturing problems, such as crystal defects, material stress, poor trench etching or filling, or planarization damage. These defects 62 may occur at the STI interface with the heavily doped source junction 38 of the reset transistor as shown. This will induce leakage current to flow from the source node (FN) to ground.

As discussed above, the current flow from the FN node to ground is used to measure the intensity of incident light. Any additional source of leakage current will adversely affect the performance of the CMOS image sensor. Further, since the STI defects 62 are somewhat random, this leakage current will occur on some pixels but not others. Therefore, the leakage current effect cannot be cancelled out. As a result, pixels that contain a defect 62 will appear to be in the presence of a large, light source even when the pixel is exposed to darkness. Such pixels are called "white pixels" since these locations in the CMOS image pixel array always appear to be "white" regardless of the actual incident image. It is a primary object of the present invention to address the problem of white pixels caused by STI-induced leakage.

Several prior art inventions relate to U.S. Pat. No. 6,347,054 to Wang et al discloses a flash memory cell having a double-diffused region and a single-diffused region. U.S. Pat. No. 6,323,054 to Yaung et al teaches a method to form an image sensor cell. The photo diode comprises a lateral p-n diode with a space between the p-n regions. Conventional, single-diffused source/drain regions are used in the reset transistor. U.S. Pat. No. 6,306,678 to Chiang et al describes a method to form a CMOS image sensor. A photoresist layer is used to protect a previously formed, photodiode element during the sidewall spacer etch on the transfer transistor gate. Conventional, single-diffused sources and drains having lightly doped drain (LDD) extensions are taught. U.S. Pat. No. 6,194,258 to Wuu teaches a method to selectively form silicide in a CMOS image sensor process. Silicide is formed on the logic-type CMOS transistors. However, a layer blocks formation of silicide in the image cell. The reset transistor uses conventional, single-diffused source/drain regions with LDD.

SUMMARY OF THE INVENTION

A principal object of the present invention is to provide an effective and very manufacturable CMOS image sensor device and method of formation.

A further object of the present invention is to provide a method to form a CMOS image sensor device with reduced occurrence of the white pixel effect.

A yet further object of the present invention is to form a CMOS image sensor where a double diffused source is used to reduce leakage on the floating node.

A yet further object of the present invention is to form the double diffused source selectively only on the floating node and not on other drain or source nodes in the pixel.

Another further object of the present invention is to provide a CMOS image sensor with improved performance having an improved source region.

In accordance with the objects of this invention, a method to form CMOS image sensors in the manufacture of an integrated circuit device is achieved. The method comprises providing a semiconductor substrate. Sensor diodes are formed in the semiconductor substrate with each diode comprising a first terminal and a second terminal. Gates are formed for transistors in the CMOS image sensors. The gate comprise a conductor layer overlying the semiconductor substrate with an insulating layer therebetween. The transistors include reset transistors. Ions are implanted into the semiconductor substrate to form source/drain regions for the transistors. The source regions of the reset transistors are formed in the first terminals of the sensor diodes. Ions are implanted into the reset transistor sources to form double diffused sources. The implanting is blocked from other source/drain regions.

Also in accordance with the objects of this invention, a CMOS image sensor device is achieved. The device comprises a semiconductor substrate. A sensor diode in the semiconductor substrate comprises a first terminal and a second terminal. A plurality of gates for transistors is in the CMOS image sensor. The gates comprise a conductor layer overlying the semiconductor substrate with an insulating layer therebetween. The transistors include reset transistors. Source/drain regions are formed for the transistors. The source regions of the reset transistors are formed in the first terminals of the sensor diodes. Double diffused sources are formed in the reset transistor sources.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method of forming a novel CMOS image sensor in an integrated circuit device. A double diffuse source is formed on the reset transistor to reduce the effects of STI defects on pixel performance. It should be clear to those experienced in the art that the present invention can be applied and extended without deviating from the scope of the present invention.

Figure 3:
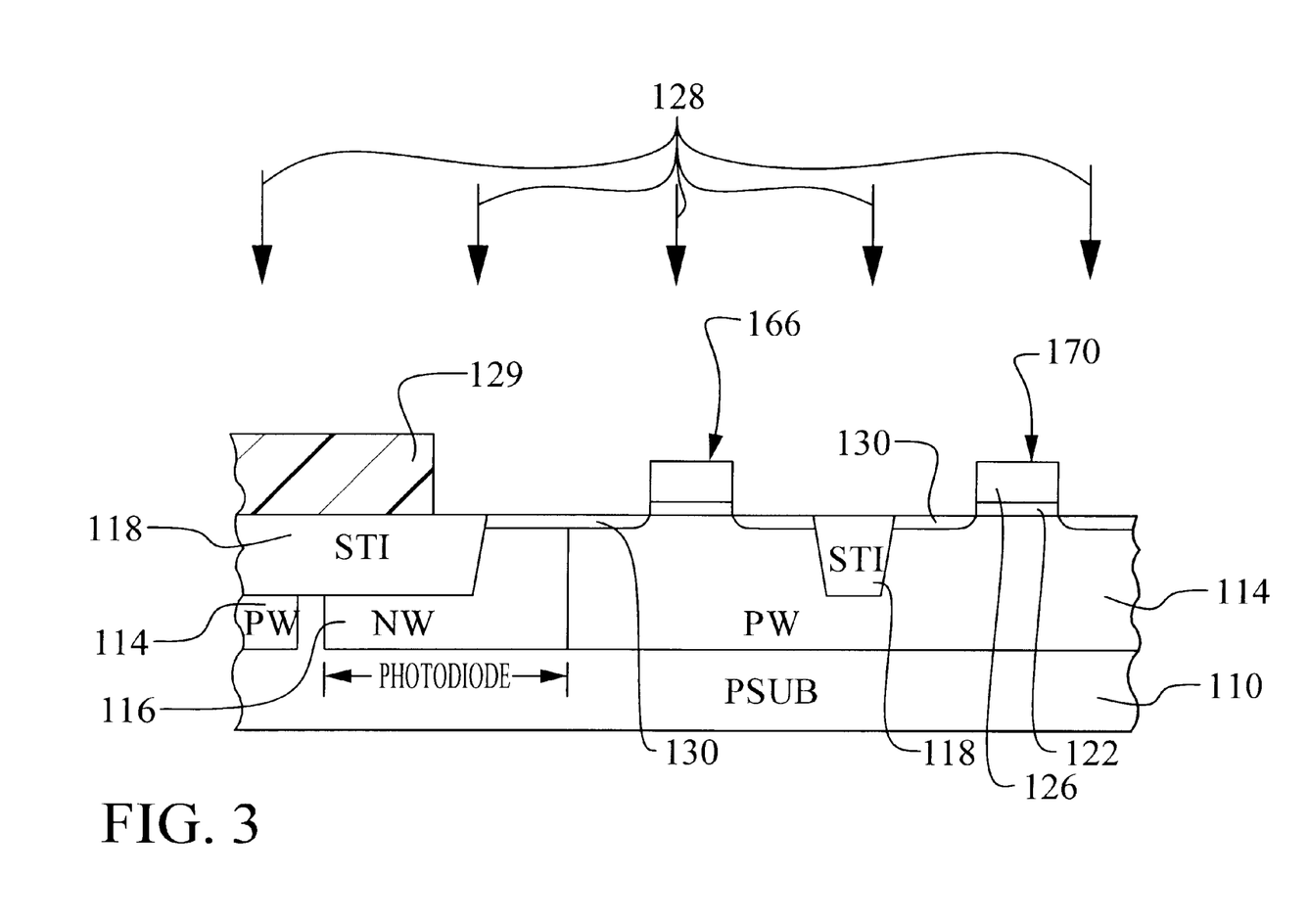
FIGS. 3 through 6 illustrate, in cross section, the preferred embodiment of the present invention.

Referring now to FIG. 3, the preferred embodiment of the present invention is illustrated. Several important features of the present invention are shown and discussed below. A partial cross section of a partially completed CMOS image sensor device of the present invention is illustrated. The cross sectional representation will be used to describe the novel method of formation as well as the useful features of the CMOS image sensor. The cross section depicts apart of a single CMOS image pixel. This pixel structure may be duplicated many times to form an array of pixels for use in distinguishing an image as is well known in the art.

The method of forming the CMOS image sensor is shown at a point wherein several standard steps have been completed. First, a semiconductor substrate 110 is provided. The semiconductor substrate preferably comprises monocrystalline silicon. Alternatively, a silicon-on-insulat or (SOI) substrate 110 could be used. Active device areas are defined in the substrate 110 by the formation of isolation regions 118. In the preferred embodiment, shallow trench isolations 118 are used as isolation boundaries between active devices. As discussed above, STI 118 isolations are best suited for very small geometry processes.

Sensor diodes are formed in the semiconductor substrate 110. Each sensor diode comprises a first terminal 116 and a second terminal 110. In the preferred embodiment, the sensor photodiodes comprise an n-well (NW) 116 formed in the semiconductor substrate 110. In this case, the first terminal comprises the NW 116 and the second terminal comprises the p-type substrate (PSUB) 110. The p-n diode so formed exhibits a relatively large depletion region under reverse bias and excellent photoelectric sensitivity. Alternatively, the photodiodes may be formed using n-wells within or adjacent to p-wells rather than a p-substrate. The NW regions 116 may be formed by selective ion implantation or by selective ion diffusion. In the preferred embodiment, second well regions 114, comprising p-well (PW), are also formed. The PW regions 114 are used for the formation of the n-channel transistors in pixel cell. The PW regions 114 may also be formed using either selective ion implantation or selective ion diffusion.

Gates 166 and 170 are formed for transistors in the CMOS image sensors. As discussed above and shown in FIG. 1, a typical CMOS image pixel will include the photodiode and three transistors comprising the reset transistor N1, the source-follower transistor N2, and the row selection transistor N3. In the cross section of FIG. 3, only two of the transistors are shown. The first gate 166 is for the reset transistor. The second gate 170 may be for either the source follower device or for the selection device. As is common practice in the art, the gates 166 and 170 comprise a conductor layer 126 overlying the semiconductor substrate 114 with an insulating layer 122 therebetween. In the preferred embodiment, the three pixel transistors comprise n-channel (NMOS) devices. Therefore, the gates 166 and 170 are formed overlying the p-type region 114.

Preferably, the insulating layer 122 comprises an oxide layer and, more preferably, a silicon oxide layer. Other types of insulators may be used as is known in the art. The conductor layer 126 preferably comprises polysilicon. The conductor layer 126 is patterned to form the gates 166 and 170 by known methods. For example, a photoresist layer, not shown, may be deposited overlying the conductor layer 126. This photoresist layer is exposed to actinic light through a mask and then developed. The photoresist layer that remains after development is then used to mask an etching step whereby the conductor layer 126 is patterned to reveal the gates 166 and 170 as shown. The photoresist layer is then stripped away.

As an important, though optional step, ions are next 128 implanted into the semiconductor substrate 110, 114, and 116 to form lightly doped drain (LDD) extensions 130 for the transistors. In the preferred embodiment, the CMOS image sensor array is formed in a very short channel process. That is, the CMOS transistors formed in the pixel array and in the surrounding circuitry on the integrated circuit device have very short channel lengths of, for example, about 0.25 microns or less. In this device regime, it is well known in the art that short channel effects (SCI) require the use of drain extensions (LDD) 130 on the transistors. As a first step in forming CMOS devices having LDD extensions 130, an ion implantation 128 is therefore performed. The LDD implant 128 uses a relatively low implantation energy of between about 20 KeV and about 50 KeV and a dose of between about $1 \times 10^{14}$ atoms/cm$^2$ and about $5 \times 10^{14}$ atoms/cm$^2$. A shallow and relatively lightly doped region 130, counter-doped to the local substrate, is thereby achieved. In this case, the LDD regions for the NMOS devices 166 and 170 in the pixel comprise lightly doped n-type. A LDD masking layer 129 is typically used to insure that the LDD implant 128, in this case the n-type LDD implant, is only performed on the NMOS devices. The masking layer 129 typically comprises a photoresist layer patterned as described above. The LDD regions 130 so formed are self-aligned to the gates 166 and 170 and comprise a surface concentration of between about $5 \times 10^{15}$ atoms/cm$^3$ and about $5 \times 10^{17}$ atoms/cm$^3$ and a depth of between about 0.05 microns and about 0.2 microns.

Figure 4:
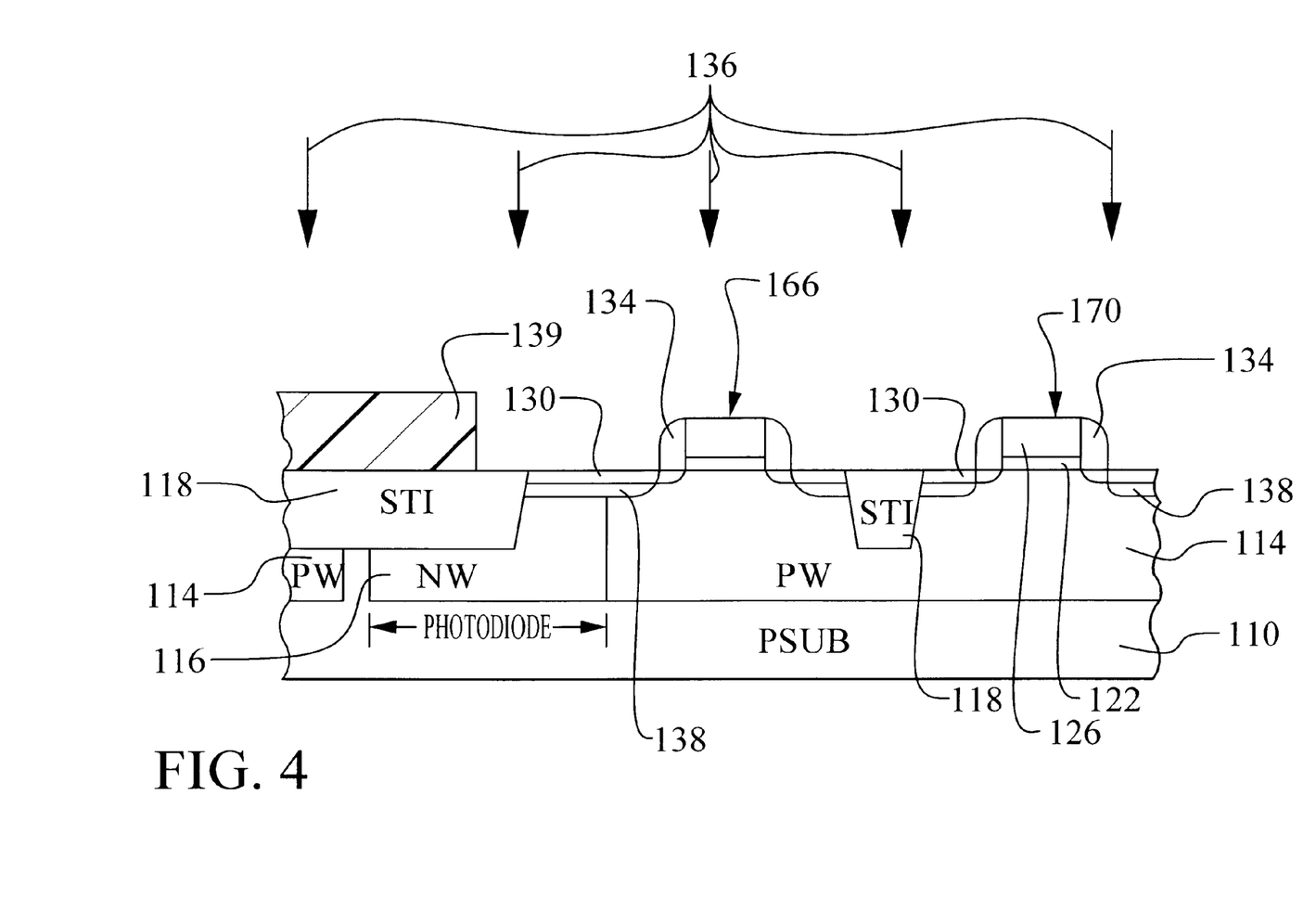

Referring now to FIG. 4, another important step in the present invention method of formation is shown. Source/drain regions 138 are formed for the transistors 166 and 170. Ions are selectively implanted 136 into the semiconductor substrate 110, 114, and 116. Prior to the ion implantation 136, spacers 134 are formed on the sidewalls of the gates 170 and 166. The formation of sidewall spacers 134 is well known in the art as a method to space the source/drain regions 138 from the edges of the gates 166 and 170. The spacers 134 may comprise, for example, an oxide layer that is first deposited and then is anisotropically etched down.

The ion implantation 136 is preferably performed using an energy of between about 5 KeV and about 40 KeV and a dose of between about $1 \times 10^{15}$ atoms/cm$^2$ and about $1 \times 10^{16}$ atoms/cm$^2$ with respect to the LDD regions 130. A deeper and relatively heavily doped region 138, counter-doped to the local substrate, is thereby achieved. In this case, the source/drain regions 138 for the NMOS devices 166 and 170 in the pixel comprise heavily doped n-type. A N+ masking layer 139 is typically used to insure that the N+ implant 136 is only performed on the NMOS devices. The masking layer 139 typically comprises a patterned photoresist layer as described above. The source/drain regions 138 so formed are self-aligned to the gates 166 and 170 and comprise a surface concentration of between about $1 \times 10^{17}$ atoms/cm$^3$ and about $1 \times 10^{19}$ atoms/cm$^3$ and a depth of between about 0.03 microns and about 0.15 microns. The source regions 138 of the reset transistors 166 are formed in the first terminals NW 116 of the sensor diodes.

Figure 5:
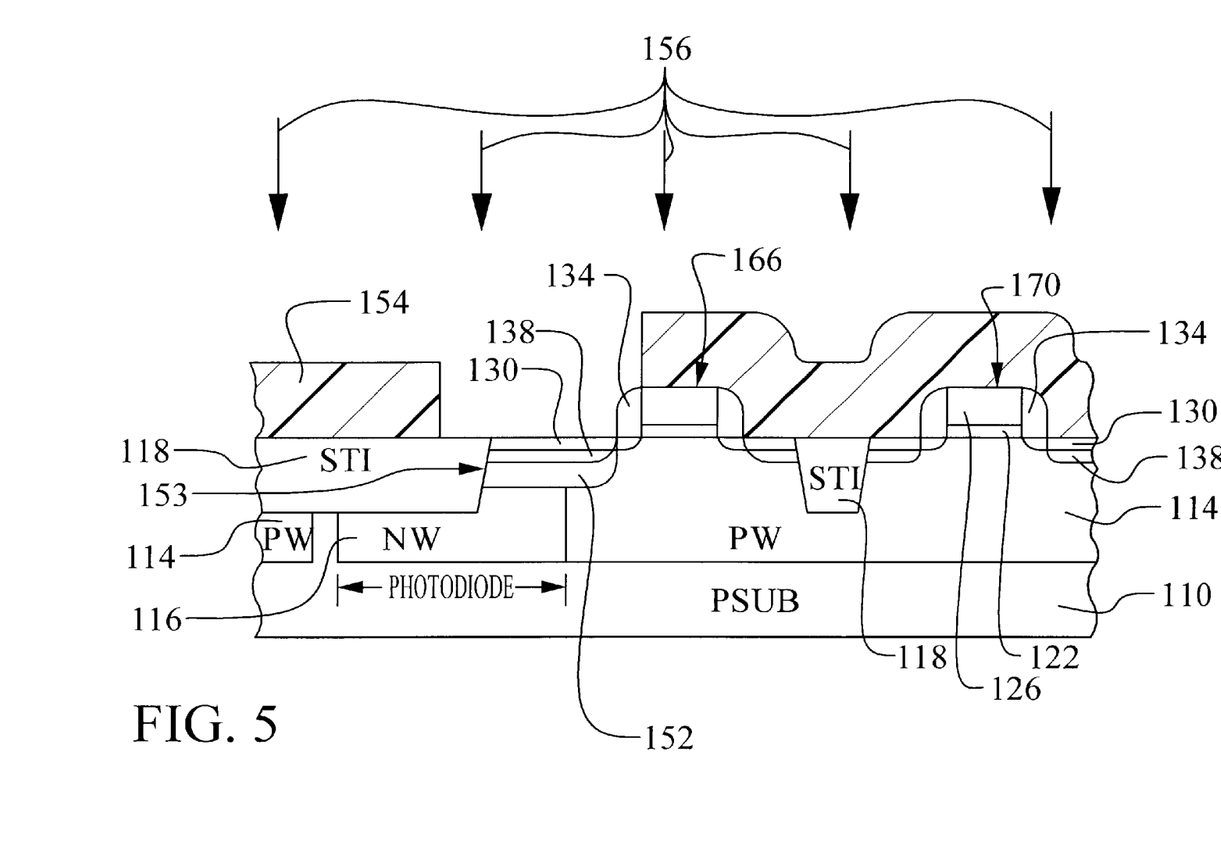

Referring now to FIG. 5, a particularly important feature of the present invention is illustrated. Ions are implanted 156 into the reset transistor 166 sources 138 to form double diffused sources 152 and to complete the formation of the transistors of the pixel. Prior to the double diffused source (DDS) implantation 156, a masking layer 154 is formed. The masking layer 154 is patterned such that openings are formed only in the source regions 138 of the reset transistors 166 where these source regions are coupled to the first terminals of the photodiodes to form the floating node (FN) for each pixel. The masking layer 154 preferably comprises a photoresist layer that is patterned as previously described.

The ion implantation 156 is preferably performed using a relatively large energy of greater than about 130 KeV and a dose of between about $3 \times 10^{13}$ atoms/cm$^2$ and about $5 \times 10^{14}$ atoms/cm$^2$. This implantation 156 forms a deep and relatively heavily doped region 152, counter-doped to the PW 114, at the source of the reset transistors 166. The DDS region 152 is substantially deeper than the source/drain regions 138. In this case, the double diffused sources 152 for the reset transistors 166 in the pixel are heavily doped n-type. The double diffused source (DDS) regions 152 so formed comprise a surface concentration of between about $1 \times 10^{14}$ atoms/cm$^3$ and about $1 \times 10^{16}$ atoms/cm$^3$ and a depth of between about 0.1 microns and about 0.5 microns.

As an important feature, the DDS implant 156 is blocked from other source/drain regions 138. That is, the openings in the masking layer 154 are only formed to expose the source regions of the reset transistors 166. In this way, the deeper, DDS regions 152 are only formed at the FN nodes where the leakage current due to STI defects 153 is most critical. The DDS regions 152 are substantially deeper than the location 153 of the STI defects to thereby correct the leakage effect. The typical source/drain regions 138 are not deep enough to correct the STI-induced leakage problem. By reducing the leakage effect due to STI defects, the novel method of the present invention eliminates the "white pixel" defects described in the prior art analysis.

It is important to note that the source/drain regions 138 of all other transistors 166 and 170 do not receive the DDS implantation 156 due to the pattern of the masking layer 154. This is important because increasing the depth of the drain regions of all transistors would cause poor device performance due to drain induced, barrier lowering (DIBL). Since the DDS implantation 156 is selective to only the reset transistor 166 source, the performance of the CMOS image pixel is improved without hurting the performance of all other transistors.

Figure 7:
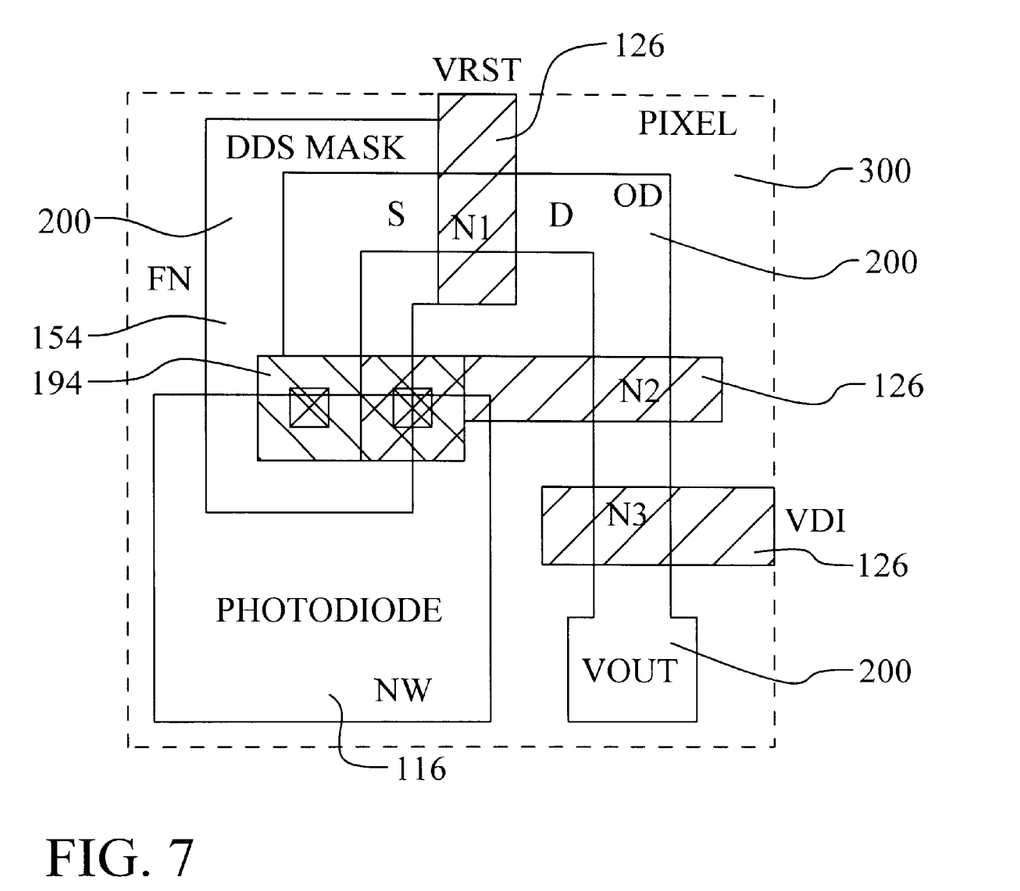
FIG. 7 illustrates, in top view, a CMOS pixel formed using the preferred embodiment of the present invention.

Referring now to FIG. 7, a top view of the layout of the pixel cell 300 of the present invention is shown. This layout shows, in simplified form, the preferred arrangement of the several layers needed to achieve the improved sensor cell function herein described. The OD or active area 200 defines the area where the transistors are formed. Conversely, the STI regions are formed in all the non-active areas 200. The NW regions 116 are formed in the PSUB to create the photodiode. Transistors N1, N2, and N3 are formed where the polysilicon layer 126 intersects the OD layer 200 and correspond to the transistor devices shown in the schematic of FIG. 1.

Most important for the present invention is the method of formation of the FN node where the source of transistor N1 couples to the first terminal (NW) of the photodiode. The DDS mask 154 opening is shown. The DDS mask opening exposes the entire source region of the reset transistor N1 to enable the DDS implant to penetrate the source OD area. The DDS implant is blocked from the other transistors N2 and N3 to prevent the DIBL effect mentioned above. Note that the DDS mask opening is preferably aligned to the source side of the gate polysilicon 126 of N1. This is important because the DDS implant ideally covers the entire N1 source area to thereby eliminate the leakage problem due to STI defects. However, it is not desirable to allow the DDS implant into the gate region of the reset transistor N1. The DDS implant uses a relatively high energy level to achieve the optimum DDS depth. This high energy could allow substantial ion penetration through the gate polysilicon 126 and into the channel region of N1. This would adversely affect device performance by reducing the threshold voltage.

It is important to note that the method of the present invention does not increase the required area of the pixel cells.

Figure 6:
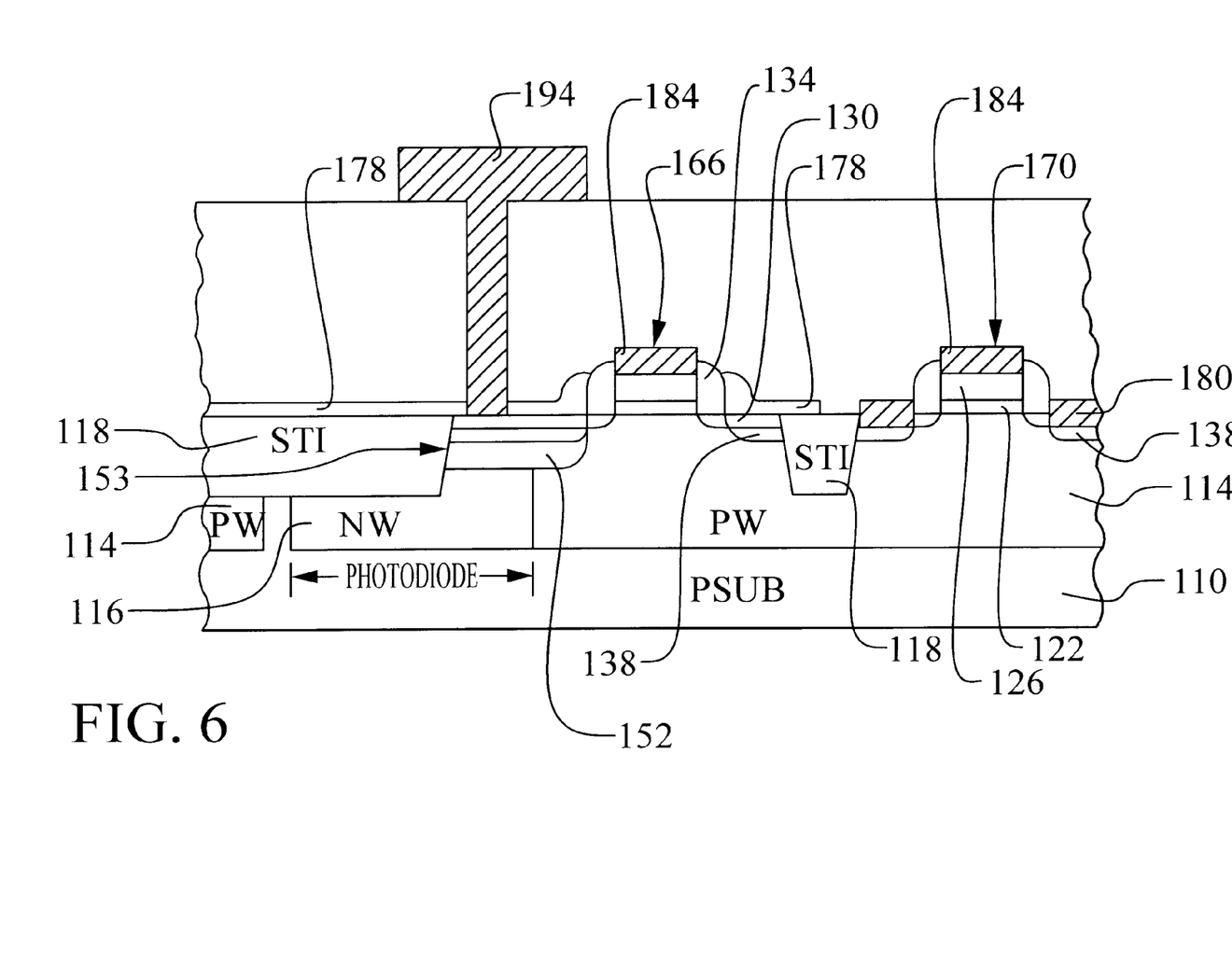

Referring now to FIG. 6, the method of the present invention is completed. If used, silicide regions 184 and 180 are formed on the gates 166 and 170 and source/drain regions 138, respectively, of the transistors. The silicide regions 184 and 180 reduce the resistance of the gates and source/drain regions to thereby improve performance. The silicide regions may be formed using a method that is well-known in the art. For example, a metal layer, such as cobalt, is deposited overlying the exposed gates and source/drain regions. An anneal step is performed which catalyzes the reaction of the metal layer with the polysilicon 126 and silicon 110 material to create silicide 180 and 184. In this case, the presence of the spacers allows the silicide to in a self-aligned fashion (salicide). The excess metal layer is then removed. Further, a protective layer 178 may be formed to prevent the formation of the salicide on the reset transistor source/drain regions 138 and 152. This may further reduce leakage on the critical FN node.

Following silicide formation, an interlayer dielectric 190 is deposited. Contact openings are formed in the interlayer dielectric to facilitate metal contact to the underlying gates and source/drain regions. A metal layer 194 is deposited and patterned to form interconnecting lines and to complete the fabrication of the integrated circuit device.

The novel device of the present invention may now be described. The CMOS image sensor device comprises a semiconductor substrate 110. A sensor diode in the semiconductor substrate 110 comprises a first terminal 116 and a second terminal 110. A plurality of gates 166 and 170 for transistors are in the CMOS image sensor device. The gates 166 and 170 comprise a conductor layer 126 overlying the semiconductor substrate 110 with an insulating layer 122 therebetween. The transistors 166 and 170 include reset transistors 166. Source/drain regions 138 are formed for the transistors 166 and 170. The source regions 138 and 152 of the reset transistors 166 are formed in the first terminals 116 of the sensor diodes. Double diffused sources 152 are formed in the reset transistor 166 sources.

The advantages of the present invention may now be summarized. An effective and very manufacturable CMOS image sensor device and method of formation are achieved. The CMOS image sensor device has a reduced occurrence of the white pixel effect due to a double diffused source that is used to reduce leakage on the floating node. The double diffused source is formed selectively only on the floating node and not on other drain or source nodes in the pixel. The resulting CMOS image sensor has improved performance due to an improved source region while other transistor devices are unaffected.

As shown in the preferred embodiments, the novel method and device of th e present invention provedes an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form CMOS image sensors in the manufacture of an integrated circuit device comprising:

providing a semiconductor substrate;

forming sensor diodes in said semiconductor substrate each comprising a first terminal and a second terminal;

forming gates for transistors in said CMOS image sensors wherein said gates comprise a conductor layer overlying said semiconductor substrate with an insulating layer therebetween and wherein said transistors include reset transistors;

implanting ions into said semiconductor substrate to form source/drain regions for said transistors wherein said source regions of said reset transistors are formed in said first terminals of said sensor diodes; and implanting ions into said reset transistor sources to form double diffused sources wherein said implanting is blocked from other said source/drain regions.

2. The method according to claim 1 wherein said sensor diodes first terminals comprise n-type, said source/drain regions comprise n-type, and said double diffused sources comprise n-type.

3. The method according to claim 1 further comprising:

implanting ions into said semiconductor substrate to form lightly doped drain extensions that are aligned to said gates; and thereafter forming sidewall spacers on said gates prior to said step of implanting ions into said semiconductor substrate to form source/drain regions.

4. The method according to claim 1 further comprising forming shallow trench isolation regions in said semiconductor substrate.

5. The method according to claim 1 wherein said step of implanting ions into said semiconductor substrate to form double diffused sources comprises an implanting energy of greater than about 130 KeV.

6. The method according to claim 1 wherein said step of implanting ions into said semiconductor substrate to form double diffused sources comprises using a patterned photoresist layer to perform said blocking.

7. The method according to claim 6 wherein said patterned photoresist layer is aligned to the edge of said gates.

8. A method to form CMOS image sensors in the manufacture of an integrated circuit device comprising:

providing a semiconductor substrate;

forming shallow trench isolation regions in said semiconductor substrate;

forming sensor diodes in said semiconductor substrate each comprising a first terminal and a second terminal;

forming gates for transistors in said CMOS image sensors wherein said gates comprise a conductor layer overlying said semiconductor substrate with an insulating layer therebetween and wherein said transistors include reset transistors;

implanting ions into said semiconductor substrate to form source/drain regions for said transistors wherein said source regions of said reset transistors are formed in said first terminals of said sensor diodes; and implanting ions into said reset transistor sources to form double diffused sources wherein said implanting is blocked from other said source/drain regions.

9. The method according to claim 8 wherein said sensor diodes first terminals comprise n-type, said source/drain regions comprise n-type, and said double diffused sources comprise n-type.

10. The method according to claim 9 further comprising:

implanting ions into said semiconductor substrate to form lightly doped drain extensions that are aligned to said gates; and thereafter forming sidewall spacers on said gates prior to said step of implanting ions into said semiconductor substrate to form source/drain regions.

11. The method according to claim 9 wherein said step of implanting ions into said semiconductor substrate to form double diffused sources comprises an implanting energy of greater than about 130 KeV.

12. The method according to claim 9 wherein said step of implanting ions into said semiconductor substrate to form double diffused sources comprises using a patterned photoresist layer to perform said blocking.

13. The method according to claim 12 wherein said patterned photoresist layer is aligned to the edge of said gates.

* * * * *